(12) United States Patent
Jeon et al.

(10) Patent No.: US 12,431,471 B2
(45) Date of Patent: Sep. 30, 2025

(54) SEMICONDUCTOR LIGHT-EMITTING DEVICE AND MANUFACTURING METHOD THEREFOR

(71) Applicant: Lumens Co., Ltd., Yongin-si (KR)

(72) Inventors: Soo Kun Jeon, Gyeonggi-do (KR); Geun Mo Jin, Gyeonggi-do (KR)

(73) Assignee: Lumens Co., Ltd., Yongin-si (KR)

( * ) Notice: Subject to any disclaimer, the term of this patent is extended or adjusted under 35 U.S.C. 154(b) by 663 days.

(21) Appl. No.: 17/636,270

(22) PCT Filed: Jun. 30, 2020

(86) PCT No.: PCT/KR2020/008513
§ 371 (c)(1),
(2) Date: Feb. 17, 2022

(87) PCT Pub. No.: WO2021/033912
PCT Pub. Date: Feb. 25, 2021

(65) Prior Publication Data
US 2022/0293570 A1    Sep. 15, 2022

(30) Foreign Application Priority Data
Aug. 21, 2019 (KR) .................. 10-2019-0102468

(51) Int. Cl.
*H10H 20/857* (2025.01)
*H01L 25/075* (2006.01)
(Continued)

(52) U.S. Cl.
CPC ......... *H01L 25/0753* (2013.01); *H10H 20/01* (2025.01); *H10H 20/8312* (2025.01); *H10H 20/857* (2025.01)

(58) Field of Classification Search
CPC ..... H01L 33/00–648; H01L 27/15–156; H01L 2933/00–0091; H01L 25/0753; H01L 21/3065; H01L 21/78
See application file for complete search history.

(56) References Cited

U.S. PATENT DOCUMENTS 9,087,932 B2    7/2015  Kim et al.
10,483,247 B2   11/2019 Lee et al.
(Continued)

FOREIGN PATENT DOCUMENTS

JP    2002-009342 A        1/2002
KR    100878434 B1  *     1/2009
(Continued)

OTHER PUBLICATIONS

International Search Report from corresponding PCT Application No. PCT/KR2020/008513, dated Oct. 29, 2020.

*Primary Examiner* — David Vu
(74) *Attorney, Agent, or Firm* — NKL LAW; Jae Youn Kim (57) ABSTRACT

The disclosure relates to a semiconductor light emitting device from which a growth substrate is removed, comprising: a semiconductor light emitting diode including a first semiconductor layer having a first conductivity, an active layer for generating light by electron-hole recombination, and a second semiconductor layer having a second conductivity different from the first conductivity, in which the first semiconductor layer is formed in a direction where the growth substrate is removed; a metal layer formed on the second semiconductor layer; and an insulating layer for covering lateral faces of the semiconductor light emitting diode and lateral faces of the metal layer, and a manufacturing method for such a semiconductor light emitting device.

11 Claims, 7 Drawing Sheets

(51) Int. Cl.
*H10H 20/01* (2025.01)
*H10H 20/831* (2025.01)

(56) References Cited

U.S. PATENT DOCUMENTS

2015/0155331 A1* 6/2015 Guenard ........... H01L 31/02008
  438/34
2018/0219131 A1* 8/2018 Park ........................ H01L 33/38
2020/0235077 A1* 7/2020 Jeon .................... H01L 33/0095

FOREIGN PATENT DOCUMENTS

| KR | 10-2014-0053530 A | 5/2014 |
| KR | 10-2017-0104829 A | 9/2017 |
| KR | 10-2018-0024228 A | 3/2018 |

* cited by examiner

SEMICONDUCTOR LIGHT-EMITTING DEVICE AND MANUFACTURING METHOD THEREFOR

CROSS-REFERENCE TO RELATED APPLICATIONS

This application is a national phase application of PCT Application No. PCT/KR2020/008513, filed on 30 Jun. 2020, which claims the benefit and priority to Korean Patent Application No. 10-2019-0102468, filed 21 Aug. 2019. The entire disclosures of the applications identified in this paragraph are incorporated herein by references.

FIELD

The present disclosure relates generally to a semiconductor light emitting device and methods for manufacturing the same. More particularly, it relates to a semiconductor light emitting device having insulation layers exclusively on lateral faces of the device and methods for manufacturing such a semiconductor light emitting device.

In the context herein, the term "semiconductor light emitting device" refers to a semiconductor optoelectronic device which generates light by electron-hole recombination. One example thereof is Group III-nitride semiconductor optical devices (LEDs, LDs), in which the Group III-nitride semiconductor is composed of a compound containing $Al(x)Ga(y)In(1-x-y)N$ ($0 \leq x \leq 1$, $0 \leq y \leq 1$, $0 \leq x+y \leq 1$). Another example thereof is GaAs-based semiconductor light emitting devices used for emitting red light.

BACKGROUND

This section provides background information related to the present disclosure which is not necessarily prior art.

Figure 1:
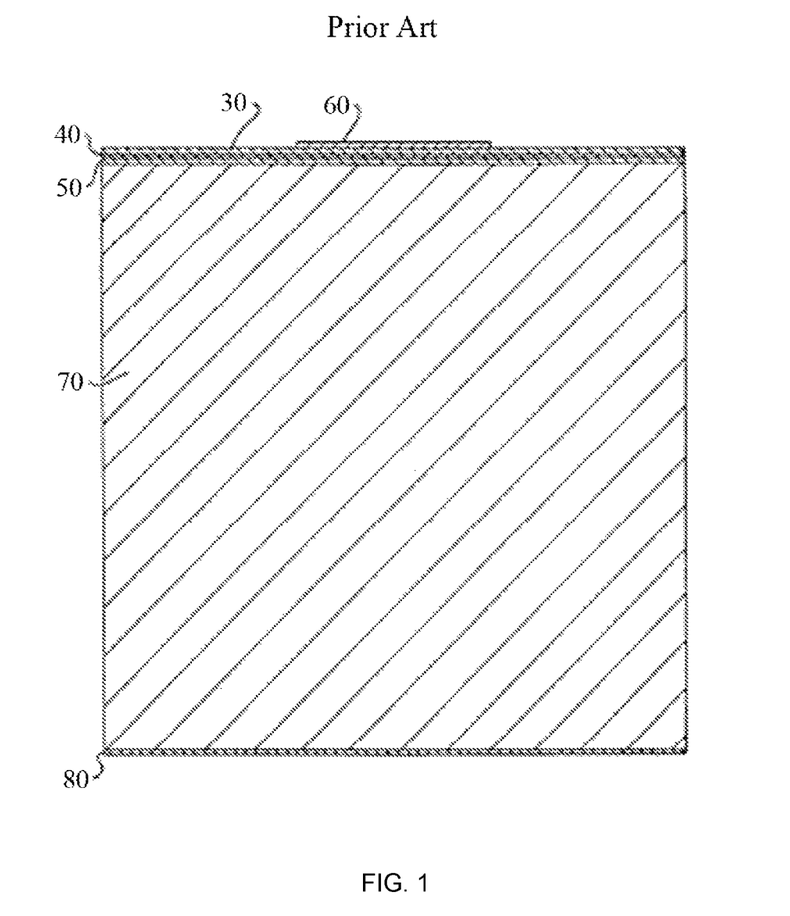
FIG. 1 shows an exemplary vertical semiconductor light emitting device.

FIG. 1 shows an exemplary vertical semiconductor light emitting device in the art.

The semiconductor light emitting device comprises a semiconductor light emitting diode (LED) having a stack of layers sequentially deposited on a substrate, including a first semiconductor layer 30 having a first conductivity (e.g., an n-type GaN layer), an active layer 40 for generating light by electron-hole recombination (e.g., an InGaN/(In)/GaN multiple quantum well (MQW)), a second semiconductor layer 50 having a second conductivity different from the first conductivity (e.g., a p-type GaN layer); a first electrode 60 formed on a region where a growth substrate (e.g., a sapphire substrate) has been removed; a supporting substrate 70 for supporting the semiconductor light emitting diode while supplying current to the second semiconductor layer 50; and a second electrode 80 formed on the supporting substrate 70. The first electrode 60 is electrically connected to an external substrate by wire bonding. One side of the second electrode 80 serves as a mounting face during electrical connections to the external substrate. The semiconductor light emitting device as shown in FIG. 1 where electrodes 60, 80 are disposed above and below the active layer 40, respectively, is called a vertical semiconductor light emitting device. In the context herein, the term "external substrate" to which a semiconductor light emitting device is electrically connected refers to a PCB (Printed Circuit Board), a submount, a TFT (Thin Film Transistor) or the like. A number of vertical semiconductor light emitting devices are described in Korean Registered Patent Publication No. 1296946 and Korean Patent Application Laid-Open No. 2014-0041527.

Figure 2:
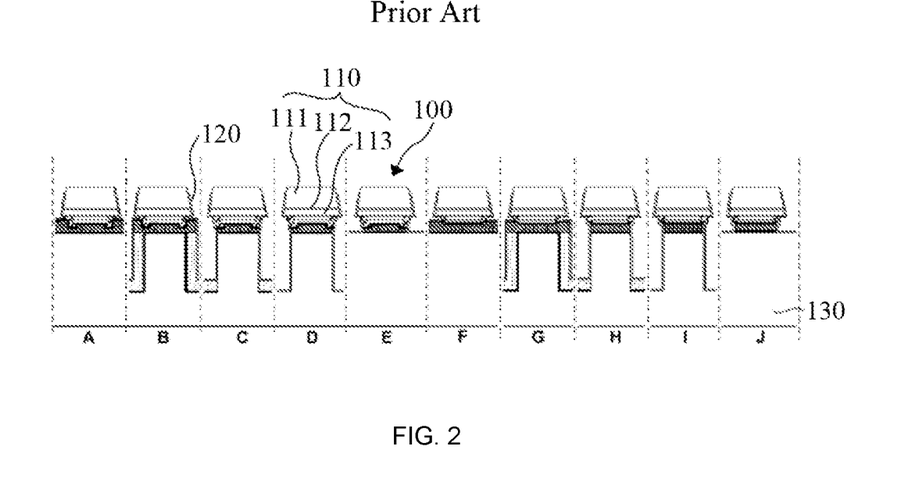
FIG. 2 shows an exemplary method for manufacturing a micro semiconductor light emitting device described in Korean Patent Application Laid-Open No. 2014-0112486.

FIG. 2 shows an exemplary method for manufacturing a micro semiconductor light emitting device 100 described in Korean Patent Application Laid-Open No. 2014-0112486. For convenience of explanation, different reference numerals are used.

In general, a micro semiconductor light emitting device refers to a semiconductor light emitting device having a maximum width of 150 μm or less, preferably 100 μm or less on a plane.

The micro semiconductor light emitting device 100 has a semiconductor light emitting diode 110 including a first semiconductor layer 111, an active layer 112, and a second semiconductor layer 113, and the lateral faces of the semiconductor light emitting diode 110 are covered with an insulating layer 120. The insulating layer 120 serves to prevent charge arcing between adjacent semiconductor light emitting diodes 110 during the pickup process of the device 100, such that any adjacent semiconductor light emitting diodes 110 would not stick together, contamination that may affect the performance of the semiconductor light emitting diode 110 could be avoided, and the device may have an insulation feature after it is mounted to an external substrate such as a PCB. In the manufacturing method described in FIG. 2, however, the insulating layer 120 for covering the lateral faces of the semiconductor light emitting diode 110 is formed after the semiconductor light emitting diode 110 is separated from the growth substrate and transferred onto a transfer plate 130.

Therefore, the present disclosure is directed to a method in which the insulating layer is formed on the lateral faces of the semiconductor light emitting diode before the semiconductor light emitting diode is separate from the growth substrate, and a semiconductor light emitting device manufactured by the method.

Objects and features of the present disclosure will be explained in further detail below.

SUMMARY

This section provides a general summary of the disclosure and is not a comprehensive disclosure of its full scope or all of its features.

According to one aspect of the present disclosure, there is provided a method for manufacturing a semiconductor light emitting device, comprising: preparing a growth substrate (S1); forming a semiconductor light emitting diode (S2) composed of a stack of layers sequentially deposited on the growth substrate, including a first semiconductor layer having a first conductivity, an active layer for generating light by electron-hole recombination, and a second semiconductor layer having a second conductivity different from the first conductivity; splitting the semiconductor light emitting diode (S3) into multiple semiconductor light emitting diodes; forming a metallic layer on each second semiconductor layer of each split semiconductor light emitting diode; forming an insulating layer (S5) for covering each semiconductor light emitting diode and the growth substrate exposed between the semiconductor light emitting diodes; and removing the insulating layer (S6) from the growth substrate by dry etching, without a mask.

According to another aspect of the present disclosure, there is provided a semiconductor light emitting device from which a growth substrate is removed, comprising: a semiconductor light emitting diode including a first semiconductor layer having a first conductivity, an active layer for generating light by electron-hole recombination, and a second semiconductor layer having a second conductivity different from the first conductivity, in which the first semiconductor layer is formed in a direction where the growth substrate is removed; a metal layer formed on the second semiconductor layer; and an insulating layer for covering lateral faces of the semiconductor light emitting diode and lateral faces of the metal layer.

These and other advantages of the present invention will be recognized by those of skill in the art in view of the following detailed description, the accompanying drawings and the appended claims.

DETAILED DESCRIPTION

The present disclosure will now be described in detail with reference to the accompanying drawing(s). Directional terms, such as "upper", "lower", "above", "below" or others used herein are defined with respect to the directions shown in the drawings.

Figure 3:
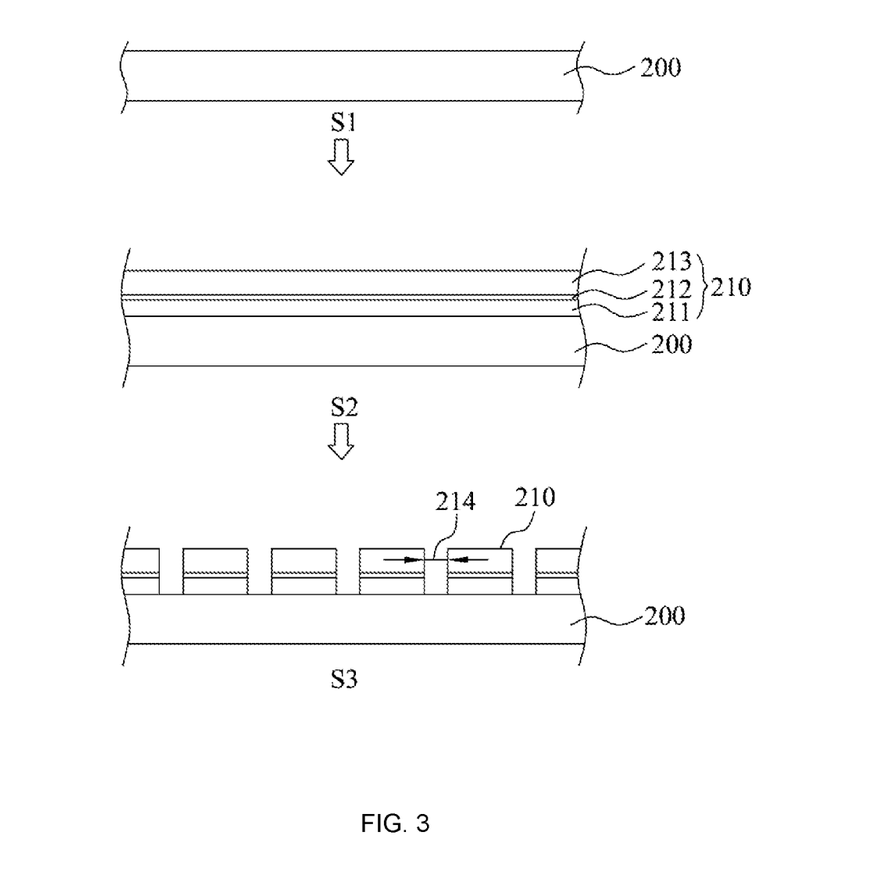
FIG. 3 and FIG. 4 show an exemplary method for manufacturing a semiconductor light emitting device according to the disclosure.
Figure 4:
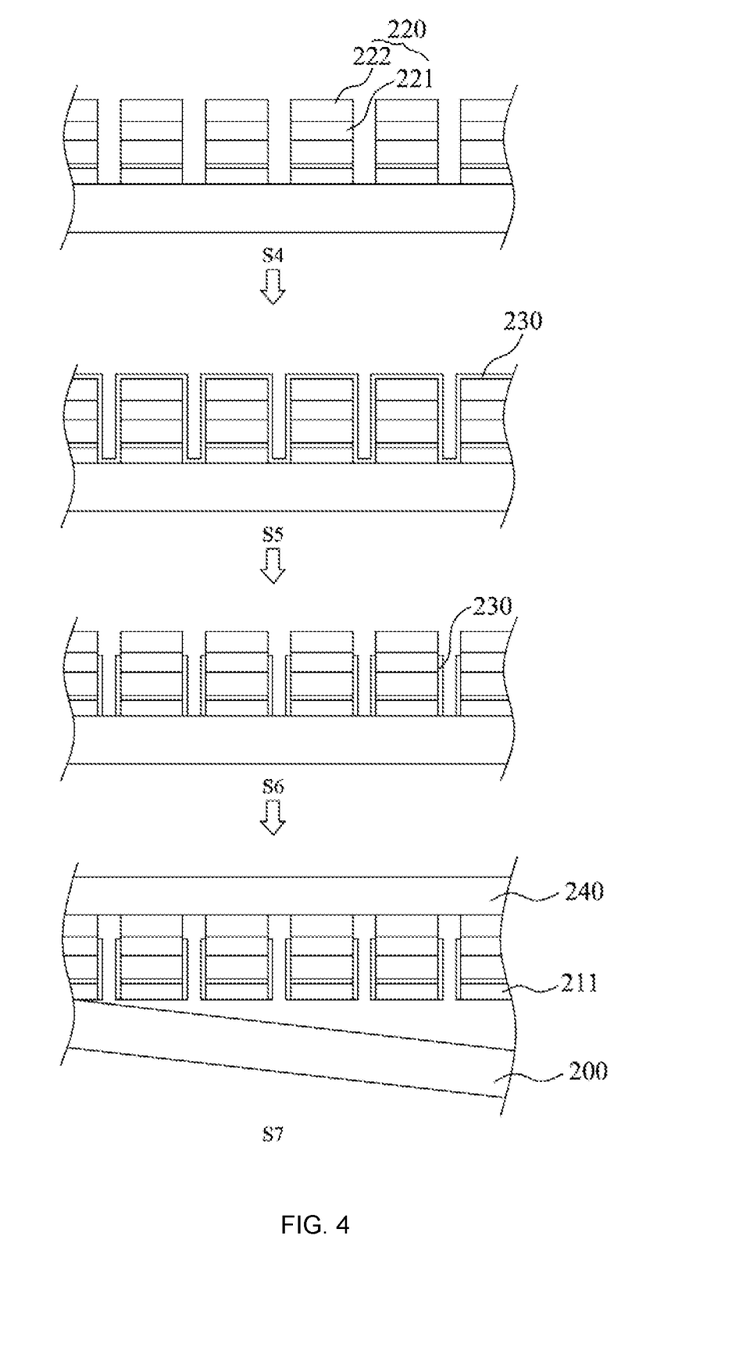

FIGS. 3 and 4 show an exemplary method for manufacturing a semiconductor light emitting device according to the disclosure.

First, a growth substrate 200 is prepared (S1). The growth substrate 200 may be made of a material such as sapphire ($Al_2O_3$), SiC, GaAs, or the like. Any materials that can grow semiconductors may be used without particular limitation. Unless specified otherwise, a semiconductor as used herein refers to a group III nitride semiconductor, and the growth substrate 200 refers to a transparent sapphire substrate. The growth substrate 200 may be prepared as a 4-6 inch wafer. A semiconductor light emitting diode 210 is then formed on the growth substrate 200 (S2). The semiconductor light emitting diode 210 may include a first semiconductor layer 211 having a first conductivity, an active layer 212, and a second semiconductor layer 213. For example, the semiconductor light emitting diode 210 may consist of an n-type semiconductor layer (Si-doped GaN) as the first semiconductor layer 211, a p-type semiconductor layer (Mg-doped GaN) as the second semiconductor layer 213, and the active layer (e.g., an InGaN/(In)/GaN multiple quantum well (MQW)). For red light emission, the semiconductor light emitting diode 210 may include an AlGaInP-based active layer 212. The semiconductor light emitting diode 210 is not particularly limited provided that it employs a PN junction and emits light by recombination of electrons and holes. The semiconductor light emitting diode 210 may be grown by deposition such as MOCVD. Although not shown, a buffer layer or a seed layer (e.g., AlN) for stable growth of a semiconductor may be formed on the growth substrate 200 before the semiconductor light emitting diode 210 is formed thereon. Next, the semiconductor light emitting diode 210 is split by etching (e.g., ICP etching) into multiple semiconductor light emitting diodes 210 (S3). Each of these individual semiconductor light emitting diodes 210 is down to a maximum width of 150 µm or less in the plane area, to obtain micro semiconductor light emitting devices. In particular, each semiconductor light emitting diode 210 may keep spacing 214 of 10 µm or less from its neighboring semiconductor light emitting diodes 210, which allows a greater number of micro semiconductor light emitting devices that can be produced from a growth substrate (e.g., a 4 inch wafer). Subsequently, a metal layer 220 is formed on the second semiconductor layer 213 of each semiconductor light emitting diode 210 (S4). The metal layer 220 may only comprise an electrode portion 221. Optionally, a soldering portion 222 may be formed on the electrode portion 221. In the drawing, the thickness of the metal layer 220 is exaggerated to facilitate explanation. The electrode portion 221 of the metal layer 220 may have a thickness of 1 µm or less, and the soldering portion 222 may have a thickness of 3 µm or less. The semiconductor light emitting diode 210 may have a thickness of 10 µm or less, and typically between 5 µm and 6 µm.

The electrode portion 221 and the soldering portion 222 may be formed by deposition. The electrode portion 221 can be made of a high work-function metal such as Ni, Au, Ag, Pd, or Pt. Additionally or optionally, the electrode portion 221 may be formed of a stack of layers including Pd, Pt, Ni, Ta, Ti and TiW, to prevent oxidation of Ag. The soldering portion 222 may be made of at least one of PbSn, AuSn, AgSn or SAC. Between the steps S2 and S4, an ITO layer (not shown) may be provided between the second semiconductor layer 213 and the metal layer 220 for current diffusion as needed. In addition, the metal layer 220 preferably has a greater thickness than the insulating layer 230 that is to be formed in the subsequent step S5. At least, the thickness of the metal layer 220 is preferably equal to or greater than the thickness of the insulating layer 230 formed on the growth substrate 200. The reason for this will be explained in further detail below with reference to FIG. 5. Moreover, the metal layer 220 is preferably formed such that it covers the entire upper face of the second semiconductor layer 213. Again, the reason for this will be explained in further detail below with reference to FIG. 5. The insulating layer 230 is formed to cover each of the semiconductor light emitting diodes 210 as well as the exposed portions of the growth substrate 200 between the semiconductor light emitting diodes 210 (S5). The insulating layer 230 may be made of materials such as silicon dioxide ($SiO_2$), aluminum oxide ($Al_2O_3$), silicon nitride, and polyimide. Although the thickness of the insulating layer 230 formed on the growth substrate 200, the upper face of the metal layer 220, and lateral faces of the metal layer 220 and of the semiconductor light emitting diode 210 may vary, it is preferably between 0.1 µm and 1 µm especially on the lateral faces of the metal layer and of the semiconductor light emitting diode so as to ensure the insulation effect discussed earlier. Next, the insulating layer 230 on the exposed portions of the growth substrate 200 between the semiconductor light emitting diodes 210 is removed by dry etching (S6). If the spacing 214 between the semiconductor light emitting diodes 210 is 10 µm or less in order to produce a greater number of micro semiconductor light emitting devices, the photolithography process which is typically used for removing the insulating layer 230 might not be an effective way to get rid of the insulating layer 230 on the exposed portions of the growth substrate 200 between the semiconductor light emitting diodes 210. In such case, a high-precision mask or photolithography equipment is required to remove the insulating layer 230, but even with this expensive mask or equipment the removal can still be difficult. Therefore, the present disclosure suggests that the insulation layer 230 on the growth substrate 200 could be removed by dry etching, instead of using a mask during the photolithography process. Because the insulating layer 230 is usually etched faster than the metal layer 220 by dry etching, it is possible to stop the dry etching process once the insulating layer 230 is removed from the growth substrate 200. At this point, while the upper face of the metal layer 220 is exposed without the insulating layer 230, the lateral faces of the metal layer 220 and of the semiconductor light emitting diode 210 are still covered with the insulating layer 230. In particular, it is preferable that part of the lateral faces of the metal layer 220 are covered with the insulating layer 230. This will also be explained in further detail below with reference to FIG. 5. Going back to FIG. 4, the growth substrate 200 is removed (S7) while each of the semiconductor light emitting diodes 210 is attached to a substrate 240. When the growth substrate 200 is a translucent sapphire substrate, it can be separated by laser lift-off (LLO); when the growth substrate 200 is non-transmissive, it can be separated by chemical lift-off (CLO). Examples of the substrate 240 may include, but are not limited to, a transfer plate for use in the manufacturing process of a micro semiconductor light emitting device, a display substrate, a lighting substrate, a substrate provided with a functional device such as a transistor or an IC, a substrate having metal redistribution lines, or an adhesive tape. Additionally or optionally, an electrode portion (not shown) may be formed on the first semiconductor layer 211. This electrode portion (not shown) that is electrically connected to the first semiconductor layer 211 is substantially the same as the electrode portion 221 that is electrically connected to the second semiconductor layer 213. The manufacturing method described above is effective not only for micro semiconductor light emitting devices, but also for general semiconductor light emitting devices in that it allows to form an insulating layer only on the lateral faces of each semiconductor light emitting device, without carrying out a photolithography process using a mask.

Figure 5:
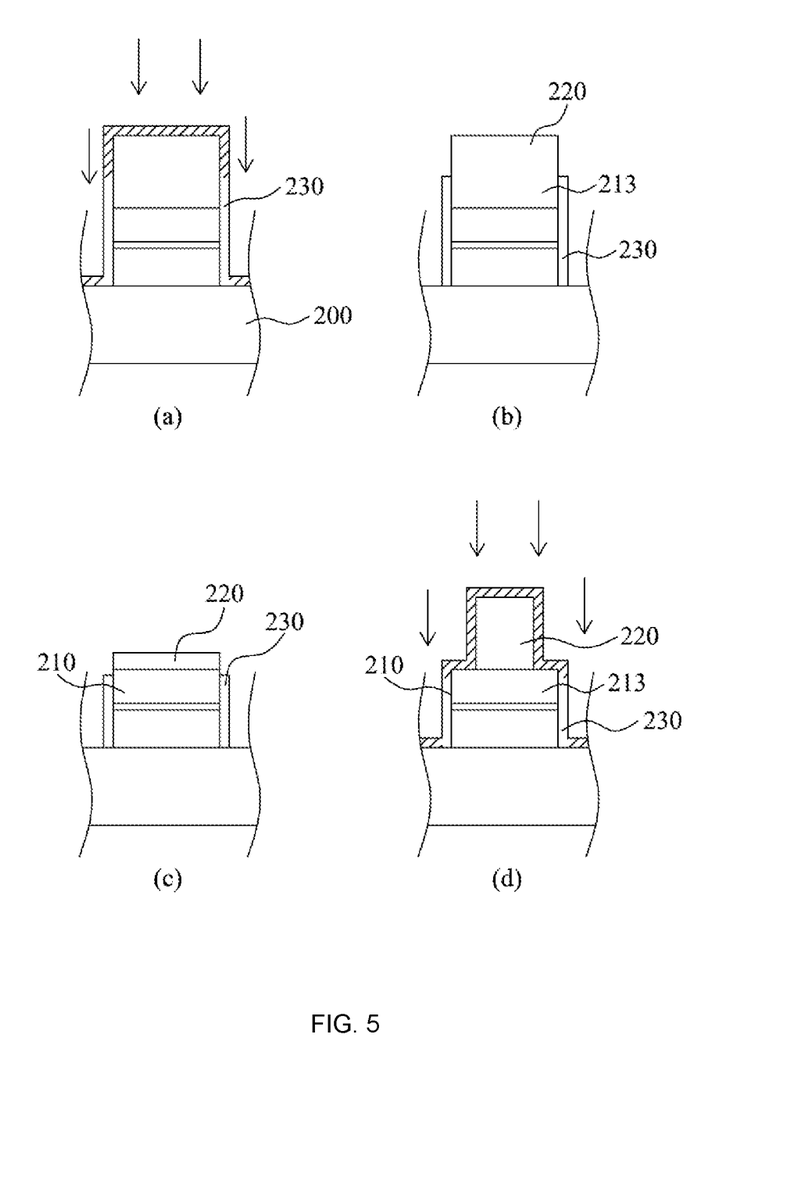
FIG. 5 illustrates principles of the method for manufacturing according to the disclosure.

FIG. 5 illustrates principles of the method for manufacturing according to the disclosure.

Referring to FIG. 5A, dry etching is carried out in the direction indicated by arrows. In other words, only the hatched areas of the insulating layer 230 that are exposed in the direction of arrow are etched. As such, the insulating layer 230 formed on the growth substrate 200 needs to be completely removed. Meanwhile, it is possible that the insulating layer 230 on the growth substrate 200 is thicker than the insulating layer 230 on the metal layer 220. If this is the case, while the insulating layer 230 on the growth substrate 200 is being removed, the insulating layer 230 on the upper face of the metal layer 220 as well as part of the insulating layer 230 on the lateral faces of the metal layer 220 and part of the upper face of the metal layer 220 might also be etched. However, since the insulating layer 230 is etched faster than the metal layer 220, part of the lateral faces of the metal layer 220 may be left without being covered with the insulating layer 230, as shown in FIG. 5B. Moreover, if the metal layer 220 is not sufficiently thick, all of it might as well be gone by the time the insulating layer 230 is completely removed, undesirably exposing the second semiconductor layer 213 of the semiconductor light emitting diode 210. In addition, as shown in FIG. 5C, further etching may be carried out even after all of the insulating layer 213 is removed from the lateral faces of the metal layer 220, which resultantly exposes part of the lateral faces of the semiconductor light emitting diode 210 from the insulating layer 230. This is not desirable as the lateral faces of the semiconductor light emitting diode 210 are not covered with the insulating layer 230. Thus, the metal layer 220 should be sufficiently thick such that the metal layer 220 is not eliminated at the time of etching the insulating layer 230 formed on the growth substrate 200, and part of the lateral faces of the metal layer 220 is remained covered with the insulating layer 230. Empirically, the thickness of the metal layer 220 is preferably equal to or greater than the thickness of the insulating layer 230 formed on the growth substrate 200. Referring to FIG. 5D, if the metal layer 220 covers only a portion of the second semiconductor layer 213, part of the lateral faces of the semiconductor light emitting diode 210 could be exposed from the insulating layer 230, which is not desirable. Therefore, the phrase 'the metal layer 220 covers the entire upper face of the second semiconductor layer 213' as mentioned earlier means that part of the lateral faces of the semiconductor light emitting diode 210 is not exposed during the dry etching process.

Figure 6:
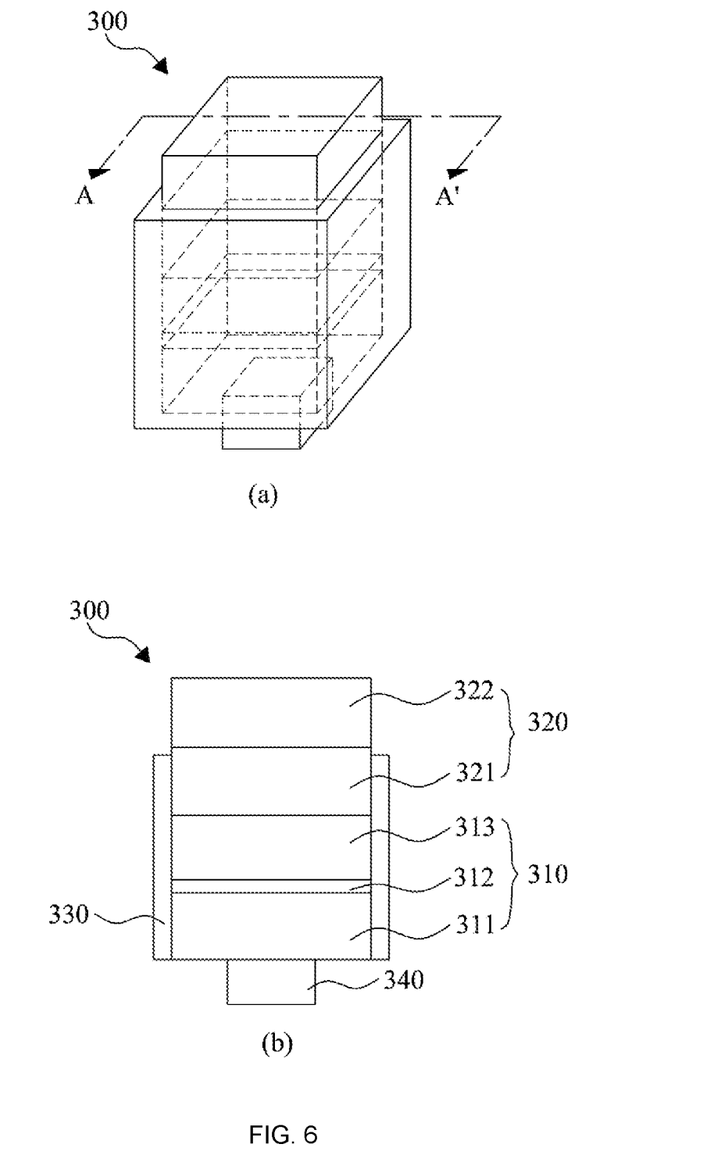
FIG. 6 shows an exemplary semiconductor light emitting device according to the disclosure.

FIG. 6 shows an exemplary semiconductor light emitting device 300 according to the disclosure.

FIG. 6A is a perspective view, and FIG. 6B is a sectional view taken along AA'.

The semiconductor light emitting device 300 includes a semiconductor light emitting diode 310 comprised of a first semiconductor layer 311 having a first conductivity, an active layer 312 for generating light by electron-hole recombination, and a second semiconductor layer 313 having a second conductivity different from the first conductivity; a metal layer 320 formed on the second semiconductor layer 313; and an insulating layer 330 for covering lateral faces of the semiconductor light emitting diode 310 and lateral faces of the metal layer 320. Additionally, an ITO (not shown) may be disposed between the metal layer 320 and the second semiconductor layer 313 for current diffusion.

The metal layer 320 may include an electrode portion 321 electrically connected to the second semiconductor layer 313, and a soldering portion 322 for electrical connection to an external substrate. Optionally, the metal layer 320 may only comprise the electrode portion 321. As illustrated in FIG. 5, the metal layer 320 preferably covers the entire upper face of the second semiconductor layer 313. Moreover, the lateral face portions of the metal layer 320 closer towards the top are preferably exposed from the insulating layer 330, while the other lateral face portions are preferably covered with the insulating layer 330. As the semiconductor light emitting diode 300 is electrically connected to an external substrate, electrical contact needs to be increased, which can be achieved by exposing a larger portion of the metal layer 220 from the insulating layer 230. It is therefore desirable that the lateral face portions of the metal layer 320 closer towards the top are exposed from the insulating layer 330, while the other lateral face portions are covered with the insulating layer 330, as illustrated FIG. 5.

The semiconductor light emitting diode 310 is grown by deposition such as MOCVD as described in FIGS. 3 and 4, in the order of the first semiconductor layer 311, the active layer 312 and the second semiconductor layer 313, from a growth substrate (not shown). The first semiconductor layer 311 is formed on a region where the growth substrate has been removed. Although not shown, a material that does not impede current flow (e.g., a buffer layer) can be provided between the lower face of the first semiconductor layer 311 and the electrode portion 340.

As discussed above, the insulating layer 330 preferably covers all of the lateral faces of the semiconductor light emitting diode 210 and part of the lateral faces of the metal layer 320. The insulating layer 330 that covers all of the lateral faces of the semiconductor light emitting diode 210 and the insulating layer 330 that covers part of the lateral faces of the metal layer 320 are continuously connected without any boundaries. In this way, the insulating layer 330 can be less damaged by possible external shocks. In case the metal layer 320 includes the soldering portion 322 as well as the electrode portion 321, the semiconductor light emitting device 300 can be electrically connected to an external substrate by molten soldering portion 322. Therefore, it is more preferable to keep the soldering portion 322 exposed from the insulating layer 330 during the soldering process. Meanwhile, if there is no soldering portion 322 and the top layer of the electrode portion 321 is Au, this top layer of the electrode portion 321 is preferably exposed from the insulating layer 330. The semiconductor light emitting device 300 shown in FIG. 6A has a quadrangular shape, but it may have a different shape including, but not limited to, a circular or triangular shape.

Figure 7:
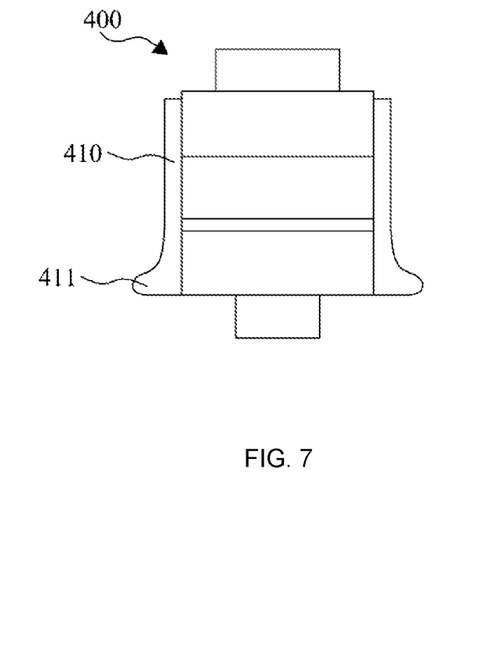
FIG. 7 illustrates advantages of a semiconductor light emitting device manufactured according to the disclosure.

FIG. 7 illustrates advantages of a semiconductor light emitting device manufactured according to the disclosure.

When a semiconductor light emitting device is manufactured by photolithography using the metal layer as a mask, the end portions of the insulating layer will be formed as shown in FIG. 6. However, when a semiconductor light emitting device 400 is manufactured by photolithography without using any expensive high-precision equipment, the end portions 411 of the insulating layer 410 are extended out as shown in FIG. 7, which can be broken and cause defects in different processes.

The below are various exemplary embodiments of the disclosure.

(1) A method for manufacturing a semiconductor light emitting device, comprising: preparing a growth substrate (S1); forming a semiconductor light emitting diode (S2) composed of a stack of layers sequentially deposited on the growth substrate, including a first semiconductor layer having a first conductivity, an active layer for generating light by electron-hole recombination, and a second semiconductor layer having a second conductivity different from the first conductivity; splitting the semiconductor light emitting diode into multiple semiconductor light emitting diodes (S3); forming a metallic layer on each second semiconductor layer of each split semiconductor light emitting diode; forming an insulating layer (S5) for covering each semiconductor light emitting diode and the growth substrate exposed between the semiconductor light emitting diodes; and removing the insulating layer (S6) from the growth substrate by dry etching, without a mask.

(2) There is also provided the method of (1), wherein splitting the semiconductor light emitting diode into multiple semiconductor light emitting diodes (S3) involves creating a gap of no greater than 10 μm between neighboring semiconductor light emitting diodes.

(3) There is also provided the method of (1), wherein forming a metal layer (S4) involves forming a metal layer on the entire face of the second semiconductor layer.

(4) There is also provided the method of (1), wherein removing the insulating layer (S6) is carried out such that the insulating layer is removed except for part of lateral faces of the metal layer.

(5) There is also provided the method of (1), further comprising: between forming a semiconductor light emitting diode (S2) and forming a metal layer (S4), forming an ITO on the second semiconductor layer.

(6) There is also provided the method of (1), wherein splitting the semiconductor light emitting diode (S3) is carried out such that each split semiconductor light emitting diode has a maximum width of no greater than 150 μm.

(7) A semiconductor light emitting device from which a growth substrate is removed, comprising: a semiconductor light emitting diode including a first semiconductor layer having a first conductivity, an active layer for generating light by electron-hole recombination, and a second semiconductor layer having a second conductivity different from the first conductivity, in which the first semiconductor layer is formed in a direction where the growth substrate is removed; a metal layer formed on the second semiconductor layer; and an insulating layer for covering lateral faces of the semiconductor light emitting diode and lateral faces of the metal layer.

(8) There is also provided the device of (7), wherein the metal layer covers the entire upper face of the second semiconductor layer.

(9) There is also provided the device of (8), wherein part of the lateral faces of the metal layer is exposed from the insulating layer.

(10) There is also provided the device of (9), wherein the metal layer includes an electrode portion electrically connected to the second semiconductor layer, and a soldering portion formed on the electrode portion, the soldering portion being exposed from the insulating layer while the electrode portion being covered with the insulating layer.

The method of the present disclosure facilitates manufacturing a vertical micro semiconductor light emitting device having a maximum width of 150 μm or less on a plane, and including lateral faces covered with an insulating layer.

What is claimed is:

1. A method for manufacturing a semiconductor light emitting device, comprising:
preparing a growth substrate;
forming a semiconductor light emitting diode composed of a stack of layers sequentially deposited on the growth substrate, including a first semiconductor layer having a first conductivity, an active layer for generating light by electron-hole recombination, and a second semiconductor layer having a second conductivity different from the first conductivity;
splitting the semiconductor light emitting diode into multiple semiconductor light emitting diodes;
forming a metallic layer on each second semiconductor layer of each of the multiple semiconductor light emitting diodes, the metallic layer including an electrode layer and a soldering layer formed on the electrode layer;
forming an insulating layer for covering each of the multiple semiconductor light emitting diode and the growth substrate exposed between the multiple semiconductor light emitting diodes; and
removing the insulating layer from the growth substrate by dry etching, without a mask, wherein the insulating layer is removed such that the upper face and lateral faces of the soldering layer are fully exposed during the removal of the insulating layer.

2. The method of claim 1, wherein splitting the semiconductor light emitting diode into multiple semiconductor light emitting diodes involves creating a gap of 10 μm or less between neighboring semiconductor light emitting diodes.

3. The method of claim 1, wherein forming the metallic layer involves forming the metallic layer on the entire face of each second semiconductor layer of each of the multiple semiconductor light emitting diodes.

4. The method of claim 1, wherein removing the insulating layer is carried out such that the insulating layer is removed except for part of lateral faces of the metallic layer on each second semiconductor layer of each of the multiple semiconductor light emitting diodes.

5. The method of claim 1, further comprising: between forming the semiconductor light emitting diode and forming the metallic layer, forming an indium tin oxide on each second semiconductor layer of each of the multiple semiconductor light emitting diodes.

6. The method of claim 1, wherein splitting the semiconductor light emitting diode is carried out such that each of the multiple semiconductor light emitting diodes has a maximum width of 150 μm or less.

7. The method of claim 1, wherein the thickness of the metallic layer is equal to or greater than the thickness of the insulating layer formed on the growth substrate.

8. The method of claim 1, wherein the thickness of the insulating layer is between 0.1 μm and 1 μm.

9. The method of claim 1, wherein the insulating layer is formed of at least one selected from the group of silicon dioxide, aluminum oxide, silicon nitride, and polyimide.

10. The method of claim 1, wherein the electrode layer is formed of at least one selected from the group of Ni, Au, Ag, Pd, Ta, Ti, TiW, and Pt, and the soldering layer is formed of at least one selected from the group of PbSn, AuSn, AgSn, and SAC(SnAgCu).

11. The method of claim 1, further comprising removing the growth substrate while each of the multiple semiconductor light emitting diodes remains attached to a device substrate.

* * * * *